United States Patent
Anvari

(10) Patent No.: US 7,817,713 B1
(45) Date of Patent: *Oct. 19, 2010

(54) ENHANCED RECONDITIONING EQUALIZER FILTER FOR NON-CONSTANT ENVELOP SIGNALS

(75) Inventor: Kiomars Anvari, 1567 Serafix Rd., Alamo, CA (US) 94507

(73) Assignee: Kiomars Anvari, Alamo, CA (US)

( * ) Notice: Subject to any disclaimer, the term of this patent is extended or adjusted under 35 U.S.C. 154(b) by 905 days.

This patent is subject to a terminal disclaimer.

(21) Appl. No.: 11/603,726

(22) Filed: Nov. 24, 2006

(51) Int. Cl.
*H03H 7/30* (2006.01)
*H04L 27/08* (2006.01)
*H03F 3/66* (2006.01)
*H03F 1/26* (2006.01)
*H03F 1/00* (2006.01)
*H04B 1/04* (2006.01)

(52) U.S. Cl. .................. 375/232; 375/229; 375/345; 375/230; 330/151; 330/149; 330/150; 330/152; 455/114.2; 455/114.3; 455/127.2

(58) Field of Classification Search ......... 375/232–234, 375/296–297; 330/149–152, 52; 455/67.11, 455/114.1–114.3
See application file for complete search history.

(56) References Cited

U.S. PATENT DOCUMENTS

| | | | | |
|---|---|---|---|---|
| 5,485,120 A * | 1/1996 | Anvari | ................... | 330/151 |
| 5,594,385 A * | 1/1997 | Anvari | ................... | 330/149 |
| 5,610,554 A * | 3/1997 | Anvari | ................... | 330/52 |
| 5,986,499 A * | 11/1999 | Myer | ................... | 330/52 |
| 6,298,097 B1 * | 10/2001 | Shalom | ................... | 375/297 |
| 6,693,957 B1 * | 2/2004 | Wingrove et al. | ................... | 375/222 |
| 7,142,831 B2 * | 11/2006 | Anvari | ................... | 455/114.2 |
| 7,146,138 B2 * | 12/2006 | Anvari | ................... | 455/114.3 |
| 7,394,849 B2 * | 7/2008 | Ibragimov et al. | ................... | 375/233 |
| 7,463,697 B2 * | 12/2008 | Maltsev et al. | ................... | 375/297 |
| 7,649,927 B1 * | 1/2010 | Anvari | ................... | 375/150 |
| 2004/0005001 A1 * | 1/2004 | Jones et al. | ................... | 375/232 |
| 2004/0203540 A1 * | 10/2004 | Anvari et al. | ................... | 455/114.3 |
| 2004/0232985 A1 * | 11/2004 | Itahara | ................... | 330/149 |
| 2007/0026820 A1 * | 2/2007 | Sarraf | ................... | 455/102 |
| 2007/0147490 A1 * | 6/2007 | Okamoto et al. | ................... | 375/232 |
| 2007/0254592 A1 * | 11/2007 | McCallister et al. | ................... | 455/67.11 |

* cited by examiner

*Primary Examiner*—Mohammad H Ghayour
*Assistant Examiner*—Eboni Giles

(57) ABSTRACT

A technique for enhanced reconditioning equalizer filter for non-constant envelope signals is described. The input to a transmitter chain is modified by an enhanced reconditioning equalizer filter, prior to being applied to the transmitter. The enhanced reconditioning equalizer filter modifies and smoothens the amplitude of the signal. The modified and smoothened signal has its peaks reduced which results in lower Crest Factor. The input to the enhanced reconditioning equalizer filter could be a baseband, an intermediate frequency (IF) or radio frequency (RF) signal. When the signal is an IF or RF signal it needs to be down converted to baseband before applied to enhanced reconditioning equalizer filter. The enhanced reconditioning equalizer filter could be implemented in digital or analog domain.

3 Claims, 3 Drawing Sheets

ENHANCED RECONDITIONING EQUALIZER FILTER FOR NON-CONSTANT ENVELOP SIGNALS

BACKGROUND OF INVENTION

The present invention relates to an enhanced reconditioning equalizer filter to boost the performance of any communication transmitter. The enhanced reconditioning equalizer filter input could be baseband, intermediate frequency (IF), or RF signal, and its output is the peak reduced and smoothened baseband signal that can be up converted to IF or RF. In any wireless communication system one of the critical sub-systems is the transmitter. This sub-system has a major contribution in cost, power consumption, and size of the system. The main reason is the requirement of communication transmitter sub-system for linear components. The higher the linearity, the higher the power consumption, cost and size. In order to minimize the cost, size and power consumption there is a need for techniques that overcome this problem. This invention conquers these challenges by using a simple and accurate enhanced reconditioning equalizer filter module used at the input to this sub-system.

SUMMARY OF INVENTION

According to the invention, an enhanced reconditioning equalizer filter that reduces baseband signal crest factor, for use with any communication transmitter sub-system, uses a plurality of simple and accurate algorithm in conjunction with intelligent signal processing to improve signal handling of any wireless, optical, or wireline communication transmitter. By intelligent, it is meant that the algorithm has features of maintaining the signal emission and quality requirements while applying the enhanced reconditioning equalizer filter. The enhanced reconditioning equalizer filter uses the transmitter sub-system input which could be a baseband, an IF or RF signal as its input and reconditions and smoothens the signal before applying it to the transmitter sub-system. The reconditioning and smoothening helps to boost the power handling of the transmitter sub-system or acts more linear. The inputs to the enhanced reconditioning equalizer filter should be within a limit that can be handled by the enhanced reconditioning equalizer filter.

In a particular embodiment, the enhanced reconditioning equalizer filter algorithm comprises a signal processing module. The signal processor performs the signal reconditioning and smoothening.

The invention will be better understood by reference to the following detailed description in conjunction with the accompanying drawings.

DESCRIPTION OF THE SPECIFIC EMBODIMENTS

In a first preferred embodiment of the invention, the enhanced reconditioning equalizer filter uses sub-harmonic sampling to convert RF or IF signals to baseband signal. In a second preferred embodiment the baseband signal is amplitude reconditioned and smoothened using a enhanced reconditioning equalizer filter. In a third embodiment the enhanced reconditioning equalizer filter adjusts the in band signal by configuring a low pass filter in a first feedforward loop. In a forth embodiment the enhanced reconditioning equalizer filter adjusts the out of band signal in a second feedforward loop. In a fifth embodiment a peak reduction filter is used to reduce the peak of main baseband signal. In a sixth embodiment a controller is used to assign the gain, delay, and control parameters to various functions of the enhanced equalizer filter. In a seventh embodiment the out put of the enhanced reconditioning equalizer filter is used as the new input to the transmit sub-system.

Figure 1:
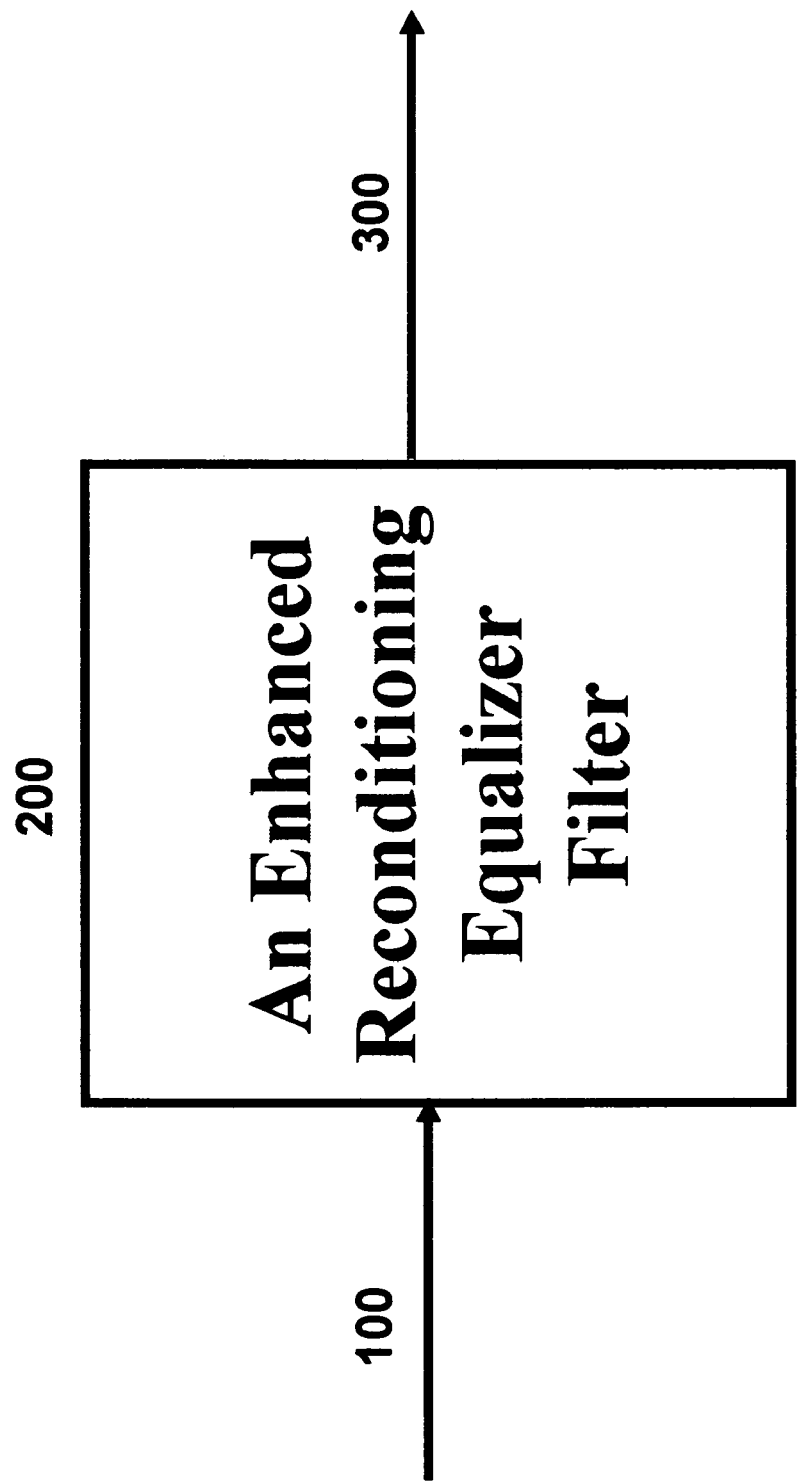
FIG. 1 is an overall block diagram of the enhanced reconditioning equalizer filter

Referring to FIG. 1, an enhanced reconditioning equalizer filter diagram is illustrated. The enhanced reconditioning equalizer filter 200 receive its baseband input 100 and produce conditioned and smoothened output 300. The enhanced reconditioning equalizer filter performs the following functions:

1. Condition and smoothen the amplitude of the input signal 100 before applying to transmitter sub-system.
2. Adjusts the gain in the signal paths to keep the total gain from input to output of the enhanced reconditioning equalizer filter unity.

Figure 2:
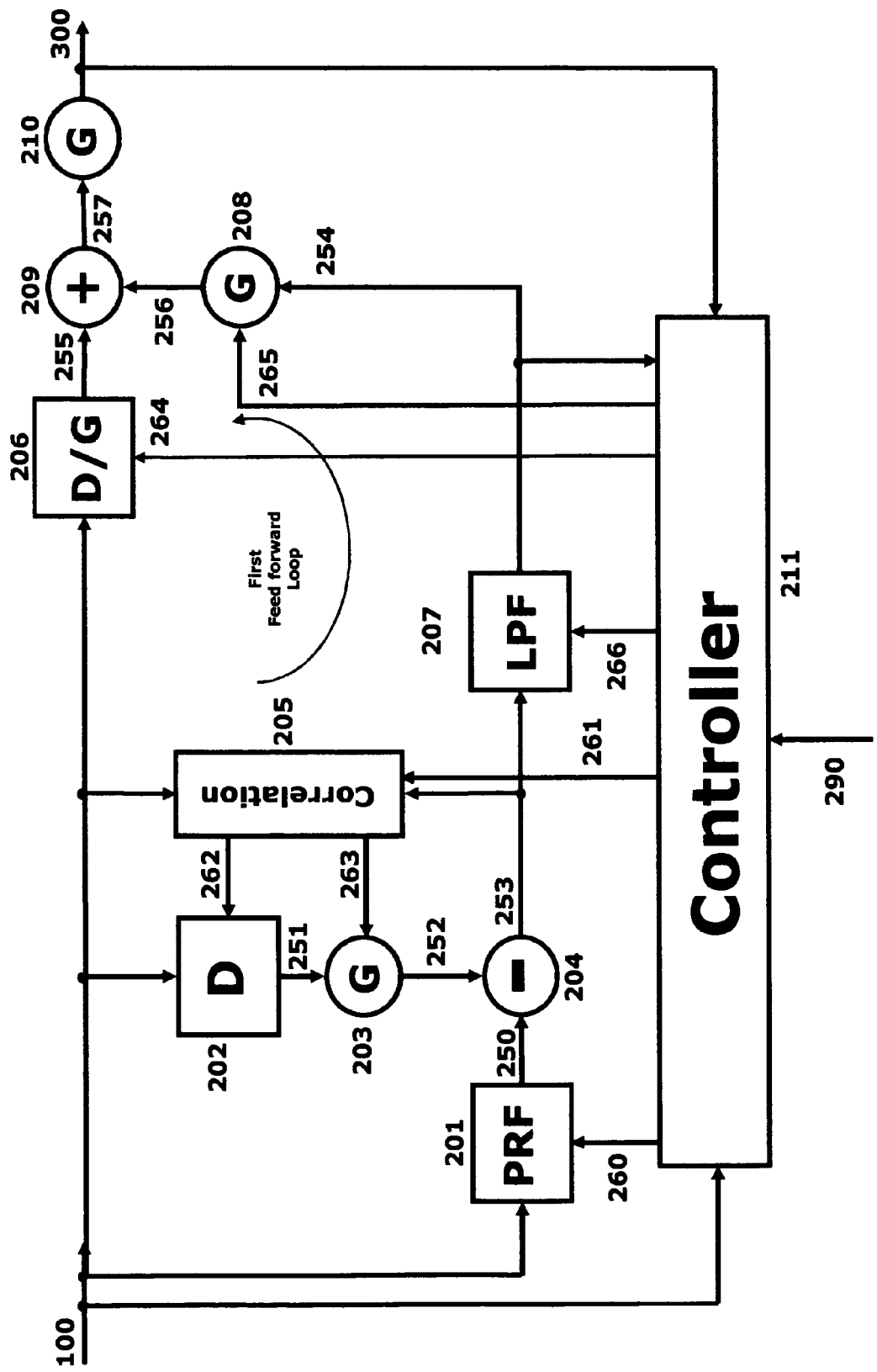
FIG. 2 is the detail block diagram of the enhanced reconditioning equalizer filter with configurable low pass filter in a first feedforward loop

FIG. 2 illustrates the detail block diagram of the reconditioning equalizer filter unit. The received main baseband signal 100 is applied to Peak Reduction Filter (PRF) 201 to produce signal 250. The PRF 201 receives control signal 260 from controller 211 to adjust the peak reduction. The main baseband signal 100 is delayed by delay block 202 to produce delayed main baseband signal 251. The delayed main baseband signal 251 is gain adjusted by gain block 203 to produce delay and gain adjusted baseband signal 252. The delay and gain adjusted baseband signal 252 is subtracted from peak reduced baseband signal 250 in subtraction block 204 to produce baseband signal 253. The amount of delay 262 and gain adjustment 263 are calculated by the correlation block 205 that uses main baseband signal 100 and signal 253 as its input. The correlation block 205 also receives a control signal 261 from controller block 211 to use to calculate the delay signal 263 and gain adjustment signal 263. The baseband signal 253 is filtered by Low Pass Filter (LPF) 207 to adjust any out of band signal and produce in-band baseband signal 254. The coefficients of the Low Pass Filter (LPF) block 207 is configurable from controller 211 to adjust the amount of out of band rejection. The coefficient parameters 266 from controller 211 used by Low Pass Filter (LPF) block 207 can be set during configuration or dynamically by monitoring the input signal 100 and output signal 300. The in-band baseband signal 254 is gain adjusted by gain block 208 to produced gain adjusted in-band baseband signal 256. The amount of gain adjustment 265 is provided by controller block 211. The main baseband signal 100 is delay and gain adjusted by delay/gain block 206 to produce delay and gain adjusted main baseband signal 255. The delay and gain adjusted main baseband signal 255 and the gain adjusted in-band baseband signal 256 are summed in summation block 209 to produce modified main baseband signal 257. The modified main baseband signal 257 is gain adjusted by gain block 210 to produce conditioned and smoothen baseband signal 300. The main baseband signal 100 and the modified baseband signal 300 are applied to controller 211 to provide the gain and delay parameters needed for the gain blocks and the correlation block.

Figure 3:
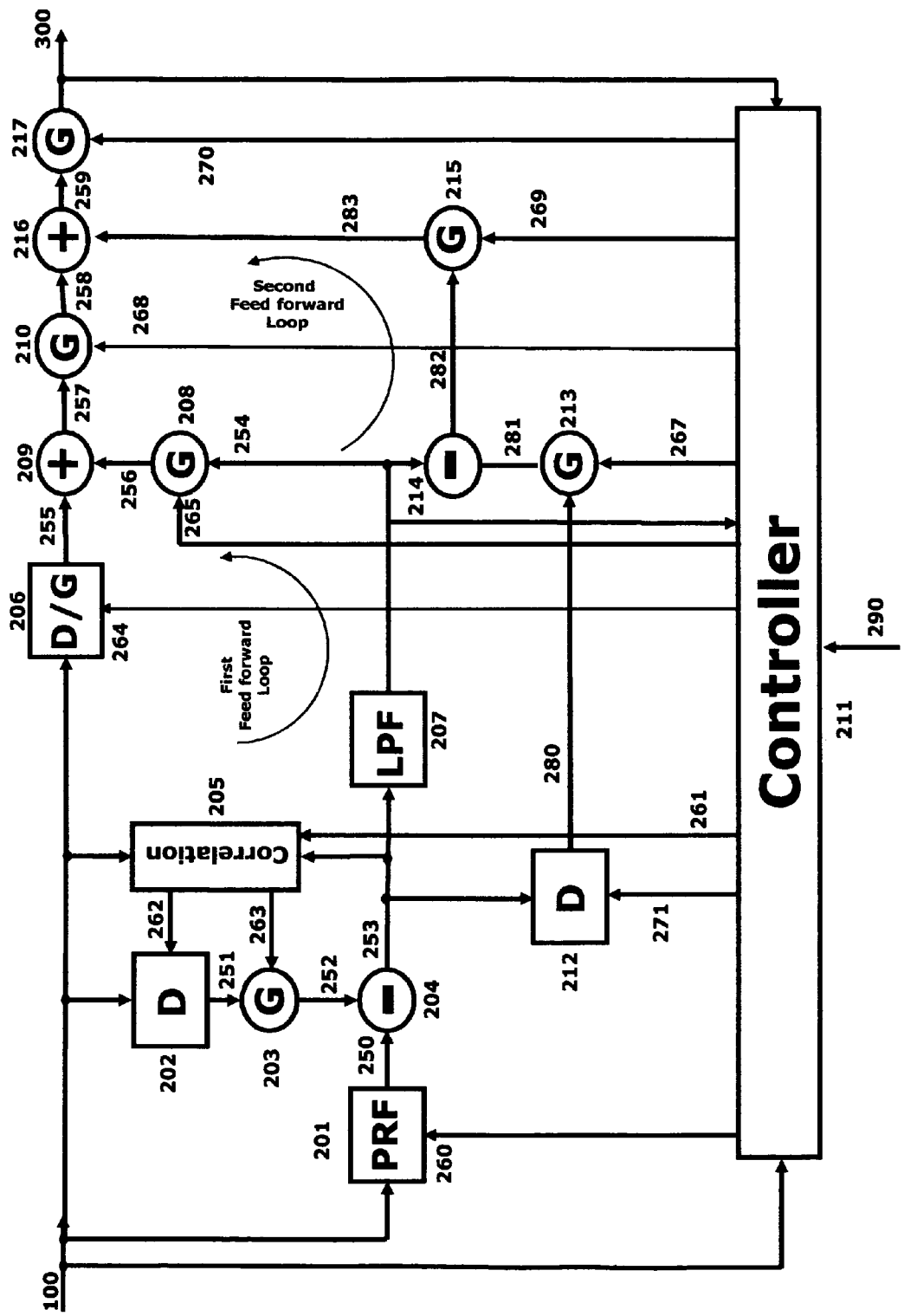
FIG. 3 is the detail block diagram of the enhanced reconditioning equalizer filter with adjustable out of band signal level by a second feedforward loop

FIG. 3 illustrates the detail block diagram of the enhanced reconditioning equalizer filter unit. The received main baseband signal 100 is applied to Peak Reduction Filter (PRF) 201 to produce signal 250. The PRF 201 receives control signal 260 from controller 211 to adjust the peak reduction. The main baseband signal 100 is delayed by delay block 202 to produce delayed main baseband signal 251. The delayed main baseband signal 251 is gain adjusted by gain block 203 to produce delay and gain adjusted baseband signal 252. The delay and gain adjusted baseband signal 252 is subtracted from peak reduced baseband signal 250 in subtraction block 204 to produce baseband signal 253. The amount of delay 262 and gain adjustment 263 are calculated by the correlation block 205 that uses main baseband signal 100 and signal 253 as its input. The correlation block 205 also receives a control signal 261 from controller block 211 to use to calculate the delay signal 263 and gain adjustment signal 263. The baseband signal 253 is filtered by Low Pass Filter (LPF) 207 to remove any out of band signal and produce in-band baseband signal 254. The in-band baseband signal 254 is gain adjusted by gain block 208 to produced gain adjusted in-band baseband signal 256. The amount of gain adjustment 265 is provided by controller block 211. The main baseband signal 100 is delay and gain adjusted by delay/gain block 206 to produce delay and gain adjusted main baseband signal 255. The delay and gain adjusted main baseband signal 255 and the gain adjusted in-band baseband signal 256 are summed in summation block 209 to produce modified main baseband signal 257. The modified main baseband signal 257 is gain adjusted by gain block 210 to produced conditioned and smoothen main baseband signal 258. The baseband signal 253 is delayed by delay block 212 to produce baseband signal 280. The baseband signal 280 is gain adjusted by gain block 213 to produce baseband signal 281. The amount of delay adjustment 271 for delay block 212 and gain adjustment 267 for gain block 213 are supplied by controller block 211. The baseband signal 281 is subtracted from baseband signal 254 in subtraction block 214 to produce the out of band baseband signal 282. The out of band baseband signal 282 is gain adjusted by gain block 215 to produced gain adjusted out of band baseband signal 283. The out of band baseband signal 283 is added to conditioned and smoothened main baseband signal 258 in summation block 216 to produce reconditioned and smoothened main baseband signal 259. The main baseband signal 259 is gain adjusted by gain block 217 to produce baseband signal 300. The amount of gain control 270 for gain block 217 is supplied by controller 211. The main baseband signal 100 and the modified main baseband signal 300 are applied to controller 211 to provide the gain, delay, coefficient, and other parameters needed for various blocks.

What is claimed is:

1. An enhanced reconditioning equalizer filter for use with non-constant envelope signals to enhance the performance of any communication transmitter, in any wireless cellular, Personal Communication System (PCS), wireless Local Area Network and Wide Area Network (LAN/WAN), Video and Audio Wireless Broadcasting, line of sight microwave, military, optical, and satellite communication systems and any other non-wireless applications, the enhanced reconditioning equalizer filter comprising:
   a first feedforward loop to adjust an injected in band baseband signal into a main baseband signal;
   a second feedforward loop to adjust an amount of out of band baseband signal injected into the main baseband signal;
   a peak reduction filter that performs peak reduction filtering to produce a peak reduced main baseband signal;
   a gain function that adjusts the gain of the main baseband signal;
   a controller that uses the main baseband signal, the output of enhanced reconditioning equalizer filter, and external information to provide control signals to various delay and gain functions as well as the peak reduction filter and a correlation function;
   a first feedforward loop comprising:
   a first gain element that adjusts the gain of the main baseband signal;
   a first delay element that adjusts the delay of the main baseband signal;
   a first subtractor that subtracts the delay and gain adjusted main baseband signal and the peak reduced main baseband signal;
   a correlation function that correlates the main baseband signal and the result of the subtraction of the peak reduced main baseband signal and the delay and gain adjusted main baseband signal to calculate the amount of the delay and gain adjustment for the main baseband signal;
   a digital finite impulse response (FIR) low pass filter with configurable coefficients that filters the result of the subtraction of the delay and gain adjusted main baseband signal and the peak reduced main baseband signal to remove or adjust the out of band baseband signal;
   a second gain element to adjust the low pass filtered subtraction of the peak reduced main baseband signal and the delay and gain adjusted main baseband signal;
   a first summer that adds the delay and gain adjusted main baseband signal and the gain adjusted low pass filtered subtraction of the peak reduced main baseband signal;
   a second feedforward loop comprising:
   a third gain element that adjusts the gain of the subtraction of the delay and gain adjusted main baseband signal and the peak reduced main baseband signal in the second feedforward loop;
   a second delay element that adjusts the delay of the subtraction of the delay and gain adjusted main baseband signal and the peak reduced main baseband signal in the second feedforward loop;
   a second subtractor that subtracts the results of the delay and gain adjusted subtraction of the delay and gain adjusted main baseband signal and the peak reduced main baseband signal and the low pass filtered subtraction of the delay and gain adjusted main baseband signal and the peak reduced main baseband signal;
   a fourth gain element that adjusts the gain of the subtraction of the results of the delay and gain adjusted subtraction of the delay and gain adjusted main baseband signal and the peak reduced main baseband signal and the low pass filtered subtraction of the delay and gain adjusted main baseband signal and the peak reduced main baseband signal;
   a second summer that adds the reconditioned and smoothened baseband signal result from first feedforward loop with the gain adjusted subtraction of the results of the gain and delay adjusted subtraction of the delay and gain adjusted main baseband signal and the peak reduced main baseband signal and the low pass filtered subtraction of the delay and gain adjusted main baseband signal and peak reduced main baseband signal to further condition and smoothen the main baseband signal.

2. The enhanced reconditioning equalizer filter according to claim 1, wherein the peak reduction filter is adjustable.

3. The enhanced reconditioning equalizer filter according to claim 1, wherein the reconditioning equalizer filter can be implemented in programmable logic, Field Programmable Gate Array (FPGA), Gate Array, Application Specific Integrated Circuit (ASIC), and DSP processor.

* * * * *